United States Patent [19]

Choi et al.

[11] Patent Number: 5,748,639
[45] Date of Patent: May 5, 1998

[54] MULTI-BIT TEST CIRCUITS FOR INTEGRATED CIRCUIT MEMORY DEVICES AND RELATED METHODS

[75] Inventors: Myung-chan Choi; Churoo Park, both of Kyungki-do, Rep. of Korea

[73] Assignee: Samsung Electronics Co., Ltd., Suwon, Rep. of Korea

[21] Appl. No.: 637,358

[22] Filed: Apr. 24, 1996

[30] Foreign Application Priority Data

Apr. 24, 1995 [KR] Rep. of Korea .................. 95-9638

[51] Int. Cl.$^6$ .................................................. G01R 31/28
[52] U.S. Cl. ........................................ 371/212; 365/201
[58] Field of Search ............................ 371/21.2, 21.1, 371/25.1, 27.5, 40.4, 37.05, 22.5; 395/183.01, 183.03, 183.06, 183.18; 365/201, 185.05, 185.07, 200, 189.05, 189.07; 364/550

[56] References Cited

U.S. PATENT DOCUMENTS

| | | | |
|---|---|---|---|
| 5,311,473 | 5/1994 | McClure et al. | 365/201 |
| 5,384,784 | 1/1995 | Mori et al. | 371/21.1 |
| 5,400,281 | 3/1995 | Morigami | 365/201 |
| 5,428,575 | 6/1995 | Fudeyasu | 365/201 |
| 5,436,911 | 7/1995 | Mori | 371/21.1 |
| 5,483,493 | 1/1996 | Shin | 365/201 |
| 5,506,849 | 4/1996 | Kato | 371/21.2 |
| 5,548,596 | 8/1996 | Tobita | 371/21.2 |

Primary Examiner—Robert W. Beausoliel, Jr.
Assistant Examiner—Nadeem Iqbal
Attorney, Agent, or Firm—Myers, Bigel, Sibley & Sajovec

[57] ABSTRACT

A method for testing a plurality of data bits includes the steps of accepting the plurality of data bits at the test circuit, and comparing first and second data bits from the plurality of data bits to determine if the first and second data bits have a common data value. A first comparison signal is generated responsive to the comparison of the first and second data bits. The first comparison signal has a first logic state when the first and second data bits have a common data value and a second logic state when the first and second data bits have different data values. Third and fourth data bits from the plurality of data bits are compared to determine if the third and fourth data bits have a common data value. A second comparison signal is generated responsive to the comparison of the third and fourth data bits wherein the second comparison signal has the first logic state when the third and fourth data bits have a common data value and the second logic state when the third and fourth data bits have different data values.

12 Claims, 7 Drawing Sheets

MULTI-BIT TEST CIRCUITS FOR INTEGRATED CIRCUIT MEMORY DEVICES AND RELATED METHODS

FIELD OF THE INVENTION

The present invention relates to the field of integrated circuits and more particularly to the field of integrated circuit memory devices.

BACKGROUND OF THE INVENTION

In order to increase speed and functionality, some memory devices employ input/output methods wherein multiple bits are simultaneously written and read. For example, some memory devices may allow simultaneous access to 4 bits of memory, 8 bits of memory, 16 bits of memory, or even 32 bits of memory. Such a multi-bit memory device, however, may increase the time and cost required to test the memory device. Accordingly, a multi-bit test method may be employed to test multiple bits in a memory device, thereby reducing the time and cost of the test. For example, when a 32-bit memory device is tested by incorporating 4-bits instead of individual bits, the test time and cost can be reduced because the test is performed only eight times.

As the number of bits in memory devices continue to increase, the number of bits incorporated during the test may also be required to be increased. Accordingly, at some point the bits incorporated in the test may not come from the same block due to the structure of the memory device.

Figure 1:
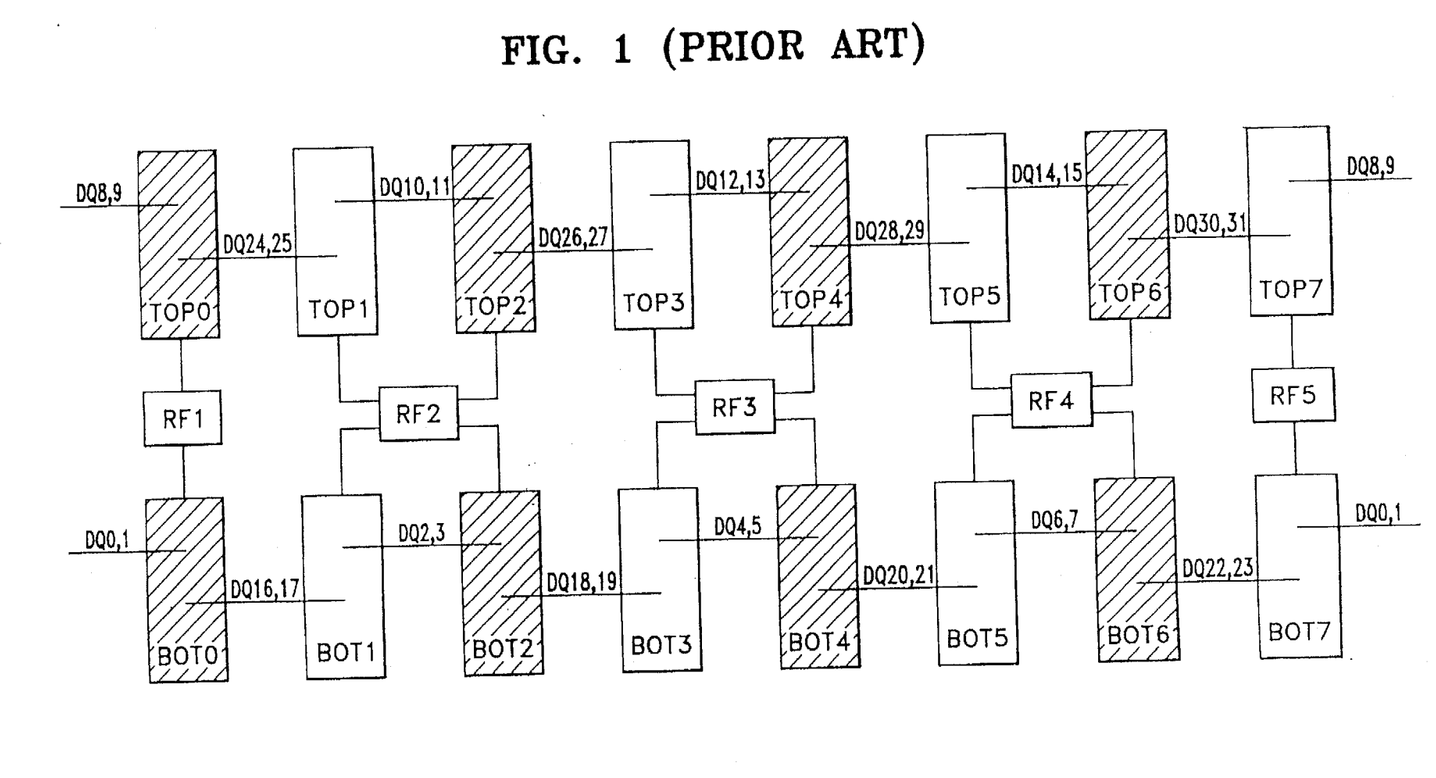
FIG. 1 is a block diagram illustrating a cell block array of a multi-bit memory device according to the prior art.

An integrated circuit memory device having a cell array block structure and a redundancy repair structure is shown in FIG. 1. This device includes eight upper blocks TOP0 to TOP7, eight lower blocks BOT0 to BOT7, and five redundancy blocks RF1 to RF5. Each of these blocks is divided into a cell array where a bit line comes out from the left side thereof and another cell array where the bit line comes out from the right side thereof. Each cell array uses two input/output lines, and reference numerals of the cell arrays are assigned according to the input/output lines. These reference numerals are indicated by (DQ0, 1), (DQ2, 3), (DQ4, 5), (DQ6, 7), (DQ8, 9), (DQ10, 11), (DQ12, 13), (DQ14, 15), (DQ16, 17), (DQ18, 19), (DQ20, 21), (DQ22, 23), (DQ24, 25), (DQ26, 27), (DQ28, 29) and (DQ30, 31). The blocks TOP0 and BOT0 use the redundancy block RF1. The blocks TOP1, TOP2, BOT1, and BOT2 use the redundancy block RF2. The blocks TOP3, TOP4, BOT3 and BOT4 use the redundancy block RF3. The blocks TOP5, TOP6, BOT5 and BOT6 use the redundancy block RF4. The blocks TOP7 and BOT7 use the redundancy block RF5.

The multi-bit test is performed by merging four bits wherein A=DQ0–3, B=DQ4–7, C=DQ8–11, D=DQ12–15, E=DQ16–19, F=DQ20–23, G=DQ24–27 and H=DQ28–31. In this test, the incorporated bits DQ0–3 do not come from the same block but are separately stored in the lower blocks BOT0, BOT1, BOT2, BOT7. In this case, A to H represent the data lines (DQs) incorporated by four bits of which a value of one bit is output to an output buffer.

Accordingly, when only test information of the block BOT0 is needed to obtain redundancy repair information, it may not be possible to obtain the necessary information by a conventional multi-bit test method.

SUMMARY OF THE INVENTION

It is therefore an object of the present invention to provide improved test circuits and methods for integrated circuit memory devices.

This and other objects are provided according to the present invention by a method for testing a plurality of data bits in an integrated circuit memory device. Subsets of the plurality of data bits can be compared separately to determine if each subset of data bits has a common data value. If a subset of data bits has a common data value, a comparison signal having a first logic state is generated. If a subset of data bits has different data values, a comparison signal having a second logic state is generated. Accordingly, a plurality of bits can be separated into subsets which can be tested separately.

In particular, this method may include the steps of accepting the plurality of data bits at the test circuit, and comparing first and second data bits from the plurality of data bits to determine if the first and second data bits have a common data value. A first comparison signal is generated responsive to the comparison of the first and second data bits. This first comparison signal has a first logic state when the first and second data bits have a common data value and a second logic state when the first and second data bits have different data values.

Third and fourth data bits from the plurality of data bits are compared to determine if the third and fourth data bits have a common data value. In response, a second comparison signal is generated wherein the second comparison signal has the first logic state when the third and fourth data bits have a common data value and the second logic state when the third and fourth data bits have different data values.

The method may also include the steps of comparing the first, second, third, and fourth data bits to determine if the first, second, third, and fourth data bits have a common data value, and generating a third comparison signal responsive to the comparison of the first, second, third, and fourth data bits. The third comparison signal has the first logic state when the first, second, third, and fourth data bits have a common data value and the second logic state when the first, second, third, and fourth data bits have different data values.

In another embodiment of the present invention, a test circuit includes test mode selection means for selecting one of a first test mode and a second test mode responsive to an external selection signal applied to the memory device. Bit comparison means is responsive to a plurality of data bits and to the test mode selection means. The bit comparison means compares first and second data bits from the plurality of data bits when the first test mode is selected, and the bit comparison means compares third and fourth data bits from the plurality of data bits when the second test mode is selected. Furthermore, comparison output generating means is responsive to the bit comparison means. The comparison output generating means generates an output signal having a first logic state when the compared data bits have a common data value and generates an output signal having a second logic state when the compared data bits have different data values.

The test mode selection means may further select one of the first test mode, the second test mode, and a third test mode responsive to the external selection signal applied to the memory device. In this case, the bit comparison means compares the first, second, third, and fourth data bits when the third test mode is selected.

The methods and circuits of the present invention thus allow the comparison of subsets of data bits within a plurality of data bits provided to the test circuit as well as the comparison of multiple subsets of data bits. Accordingly, efficient testing of a memory device can be provided.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 2:
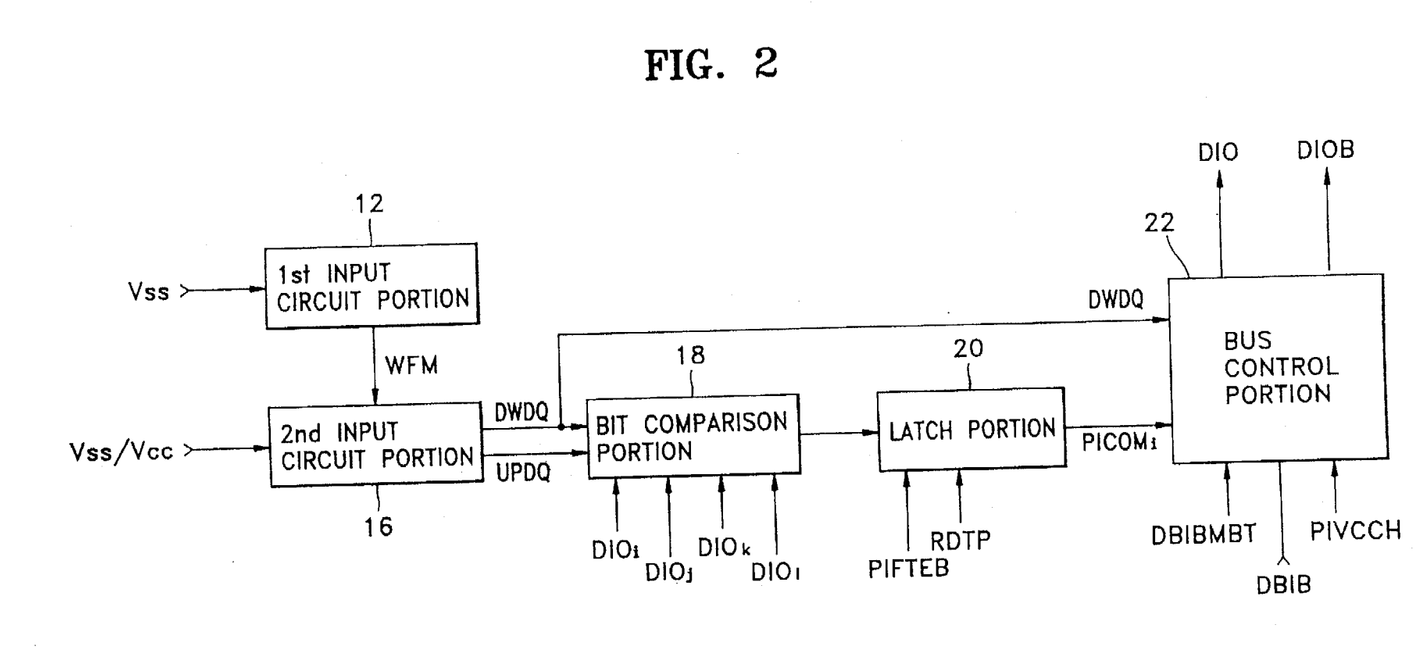
FIG. 2 is a block diagram of a multi-bit test circuit according to the present invention.

A multi-bit test circuit according to the present invention is shown in FIG. 2. This test circuit includes a first input circuit 12 which generates an internal test mode enable signal WFM in response to a received test mode enable signal Vss; a second input circuit 16 which generates test mode selection signals DWDQ and UPDQ in response to the internal test mode enable signal WFM and a test mode selection signal Vss/Vcc; a bit comparison circuit 18 which compares a plurality of data bits DIOi, DIOj, DIOk and DIOl and determines if the bit values are in congruity (the same). This comparison is performed in response to the internal test mode selection signals DWDQ and UPDQ generated by the second input circuit 16. An output from the bit comparison circuit 18 indicates whether the data bit values are the same (in congruity). A latch circuit 20 latches the output of the bit comparison circuit 18 in response to a read data transmission signal RDTP in a multi-bit test mode. A bus control circuit 22 connects a data bus DBIB to data input/output lines DIO and DIOB in response to the output of the latch circuit 20 and the internal test mode selection signal DWDQ.

Figure 3:
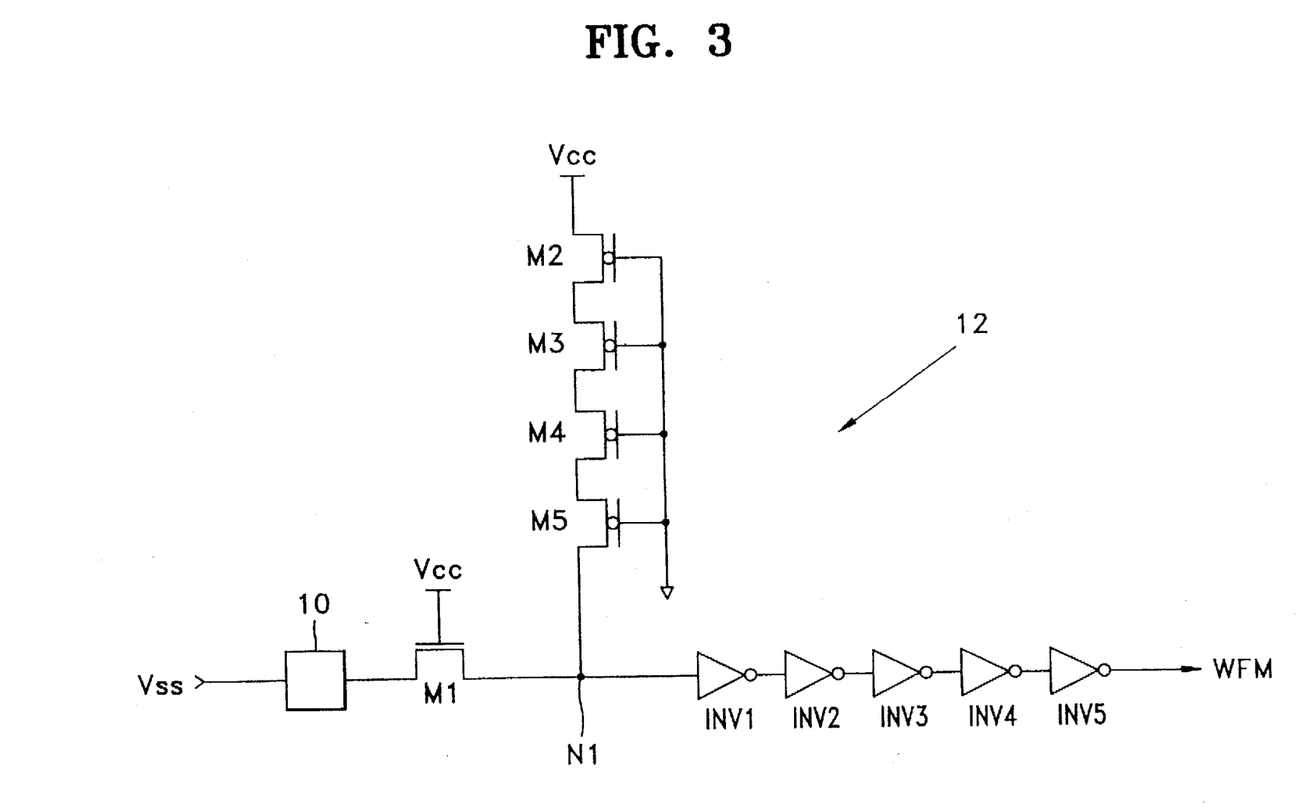
FIG. 3 is a circuit diagram of a first input circuit according to FIG. 2.

FIG. 3 shows a first input circuit 12 which generates the internal test mode enable signal WFM (wafer mode) in response to the test mode enable signal Vss which is received at a first input portion 10. The first input circuit 10 includes a pass transistor M1 connected between the first input port 10 and a node N1. The supply voltage Vcc is applied to a gate of the pass transistor M1, and four pull-up transistors M2, M3, M4, and M5 are connected between the supply voltage Vcc and the node N1. Each gate of the pull-up transistors is grounded and five inverters INV1, INV2, INV3, INV4, and INV5 are connected in series between the node N1 and an output port. When the test mode enable signal Vss is not applied to the input port 10 the input port 10 is in a floating state, and the internal test mode enable signal WFM is maintained in a low state by the pull-up transistors M2, M3, M4, and M5. Accordingly, when the internal test mode enable signal WFM is at a low state, a conventional multi-bit test is performed. When the internal test mode enable signal WFM is maintained at a high state, a test is performed wherein particular bits are combined.

Figure 4:
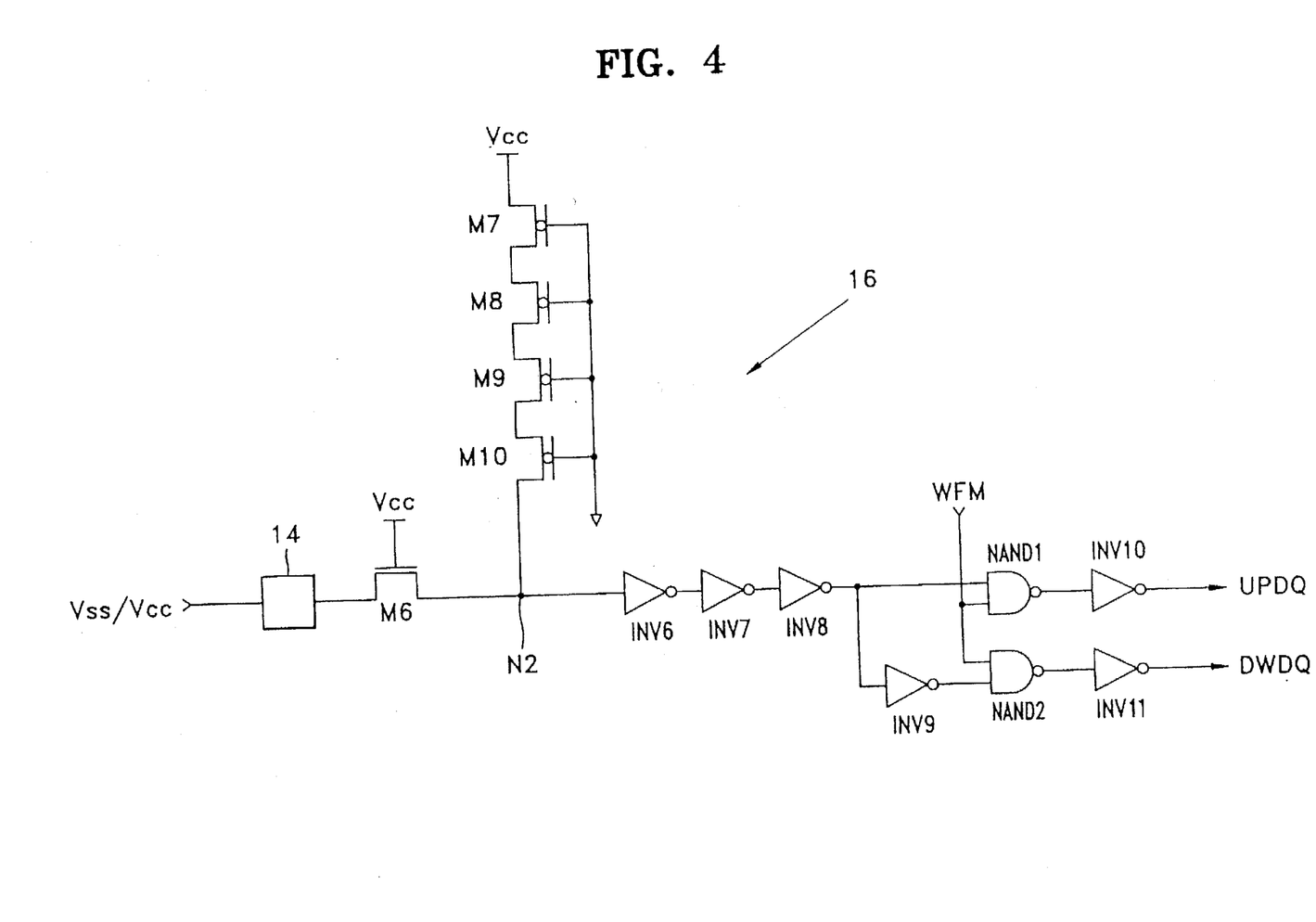
FIG. 4 is a circuit diagram of a second input circuit according to FIG. 2.

FIG. 4 shows a second input circuit 16 which generates internal test mode selection signals UPDQ and DWDQ in response to the test mode selection signal Vss/Vcc received at the second input port 14 and the internal test mode enable signal WFM generated by the first input circuit 12. The second input circuit 16 includes a pass transistor M6 connected between the second input port 14 and a node N2 where the supply voltage Vcc is applied to the gate of the pass transistor M6. Four pull-up transistors M7, M8, M9, and M10, are connected between the supply voltage Vcc and the node N2 where each gate thereof is grounded. Three inverters INV6, INV7, and INV8 are connected in series between the node N2 and an output gating unit. The output gating unit generates the two outputs UPDQ and DWDQ in response to the internal test mode enable signal WFM generated by the first input circuit 12. The gating unit includes an inverter INV9, two NAND gates NAND1 and NAND2, and two inverters INV10 and INV11 as shown in FIG. 4. Accordingly, when the WFM signal is in a low state, the UPDQ and DWDQ signals are maintained in a low state. When the WFM signal is at a high state, a test mode selection signal Vss/Vcc is output as an up-bit selection signal UPDQ or a down-bit selection signal DWDQ. In particular, when the WFM signal is in a high state and the test mode selection signal Vss/Vcc is in a low state, the UPDQ signal will be in a high state and the DWDQ signal will be in a low state. When the WFM signal is in a high state and the Vss/Vcc signal is in a high state, the UPDQ signal will be in a low state and the DWDQ signal will be in a high state.

Figure 5:
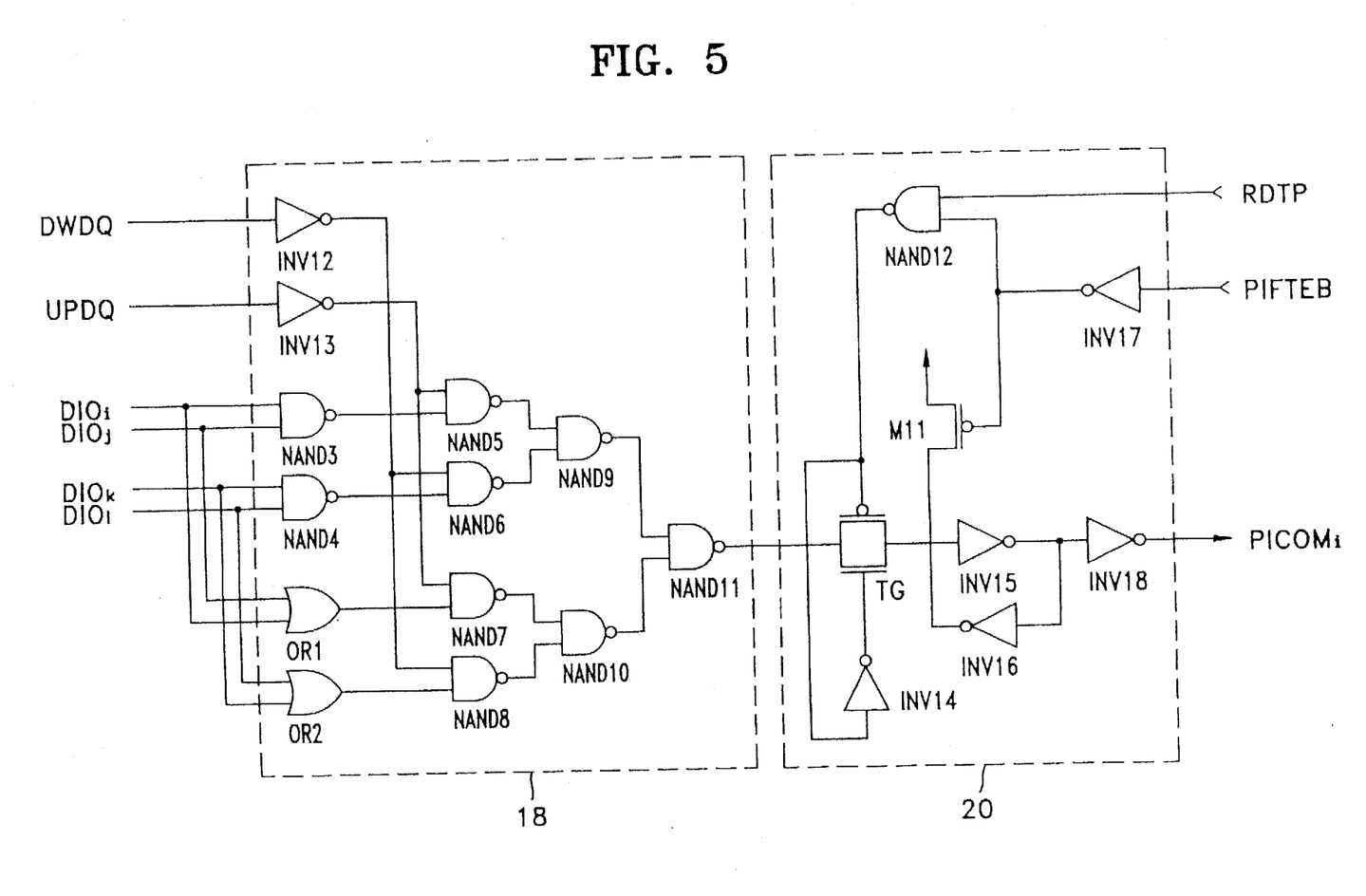
FIG. 5 is a circuit diagram of a bit comparison circuit and a latch circuit according to FIG. 2.

FIG. 5 shows the bit comparison circuit 18 which compares a plurality of data bit values DIOi, DIOj, DIOk and DIOl and determines whether the values are the same (in congruity) according to the internal test mode selection signals DWDQ and UPDQ. The latch circuit 20 latches the output of the bit comparison circuit 18 in response to a read data transmission signal RDTP when in the multi-bit test mode.

The bit comparison circuit 18 has inputs for each of the incorporated bits. Accordingly, the comparison circuit 18 of FIG. 5 which has 4 data bit inputs allows a 4 bit incorporation test method. Higher numbers of input data bits can be tested according to the present invention by providing multiple bit comparison circuits. For example, 8-bit comparison circuits can be used to provide a 32-bit test method which adopts 4-bit incorporation. Each bit comparison circuit 18 includes two NAND gates, NAND3 and NAND4 for comparing two bits at a time. That is, data bits DIOi and DIOj can be compared to determine whether the two bits are the same, and data bits DIOk and DIOl can be compared to determine whether the two bits are the same. Two OR gates, OR1 and OR2 compare two bits to determine whether the two bits are different. Four NAND gates, NAND5, NAND6, NAND7 and NAND8 selectively gate each output of the two NAND gates NAND3 and NAND4 and two OR gates, OR1 and OR2 in response to the inverted signals of the UPDQ and DWDQ signals from the second input circuit 16 which are inverted by inverters INV12 and INV13. NAND gates NAND9 and NAND10 incorporate the output of the four NAND gates NAND5, NAND6, NAND7 and NAND8 into two signals which are incorporated into a final comparison output by NAND gate NAND11.

The latch circuit 20 includes a NAND gate NAND12 for enabling the read data transmission signal RDTP when a multi-bit test mode signal PIFTEB is in a low state. A transmission gate TG and an inverter INV14 transmit the output of the bit comparison circuit 18 in response to the output of the NAND gate. A latch having two inverters INV15 and INV16 latches the transmitted comparison result, and an inverter INV17 inverts the multi-bit test mode signal PIFTEB. A pull-up PMOS transistor M11 fixes the input of the latch at a high state when the circuit is not in a multi-bit test mode. Another inverter INV18 outputs a comparison signal PICOMi by inverting the output of the latch.

Figure 6:
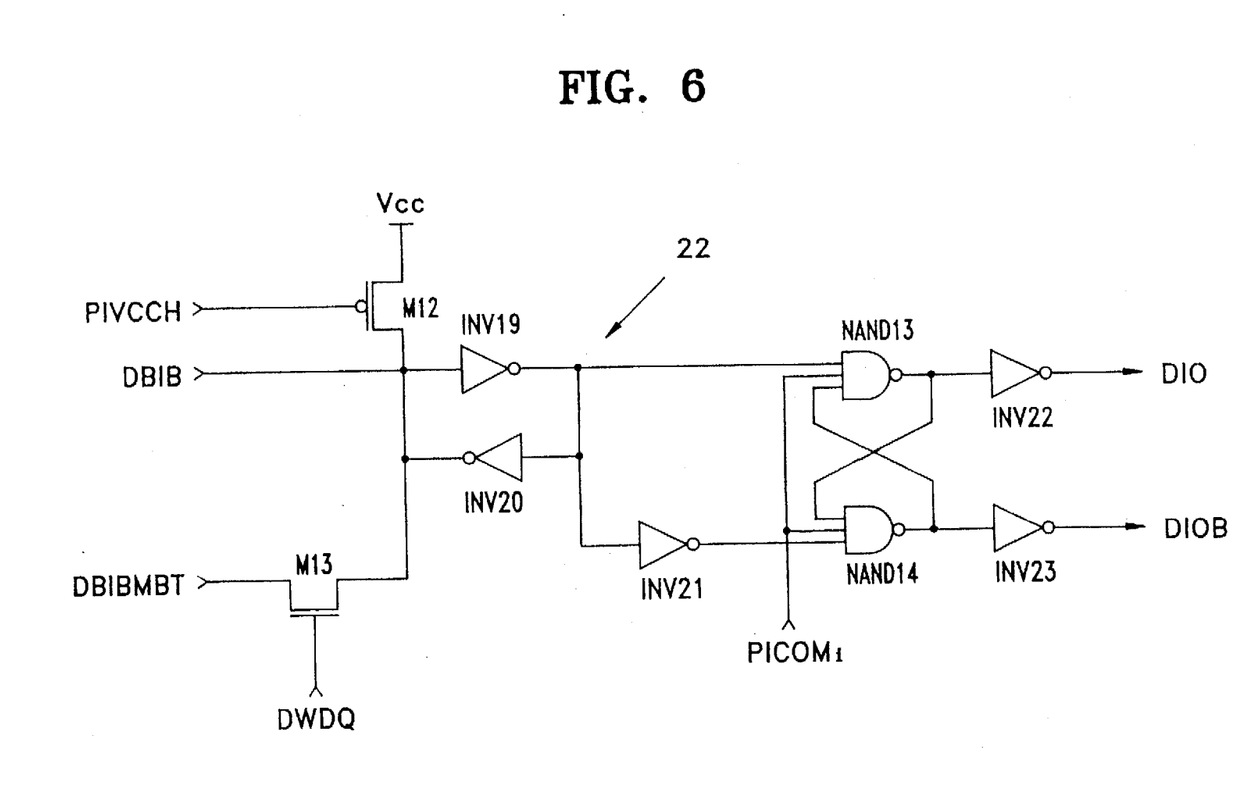
FIG. 6 is a circuit diagram of a bus control circuit according to FIG. 2.

FIG. 6 shows a bus control circuit 22 which connects a data bus DBIB to data input/output lines DIO and DIOB in response to the internal test mode selection signals DWDQ and the output PICOMi of the latch circuit 20. The bus control circuit 22 includes a pull-up PMOS transistor M12 connected between the supply voltage Vcc and the data bus DBIB. A switching control signal PIVCCH is applied to a gate of the transistor M12, and an NMOS transistor M13 is connected between the data bus DBIB and a data bus multi-bit test signal input DBIBMBT. The DWDQ signal is applied to a gate of transistor M13. A bus latch having two inverters INV19 and INV20, a line driver having an inverter INV21, two NAND gates NAND13 and NAND14, and two inverters INV22 and INV23 connect the output of the bus latch to the data lines DIO and DIOB in response to the PICOMi signal.

The operation of the test circuit of the present invention will now be described with reference to FIG. 1. To obtain test information on the BOT0 in the cell array block structure of the memory device of FIG. 1, the eight incorporated bits are merged by four bits which are: A=DQ0–3, B=DQ4–7, C=DQ8–11, D=DQ12–15, E=DQ16–19, F=DQ20–23, G=DQ24–27 and H=DQ28–31. These are bits are separated into up- and down-bits DWDQ and UPDQ as shown in Table 1.

TABLE 1

| DQ0 | DWDQ | DQ8 | DWDQ | DQ16 | UPDQ | DQ24 | UPDQ |
|-----|------|-----|------|------|------|------|------|
| DQ1 |      | DQ9 |      | DQ17 |      | DQ25 |      |
| DQ2 | UPDQ | DQ10 | UPDQ | DQ18 | DWDQ | DQ26 | DWDQ |
| DQ3 |      | DQ11 |      | DQ19 |      | DQ27 |      |
| DQ4 | DWDQ | DQ12 | DWDQ | DQ20 | UPDQ | DQ28 | UPDQ |
| DQ5 |      | DQ13 |      | DQ21 |      | DQ29 |      |
| DQ6 | UPDQ | DQ15 | UPD1 | DQ22 | DWDQ | DQ30 | DWDQ |
| DQ7 |      | DQ15 |      | DQ23 |      | DQ31 |      |

In order to obtain the test information on the BOT0 block in FIG. 1 after separation of the bits, hatched blocks of FIG. 1 are selected according to block selection information. The results of the test of the incorporated bits E and A in the up- and down-bits are respectively obtained. The classification of the up-bits and the down-bits is information used in a particular test only. By using such a method, each bit can be tested during the multi-bit test. That is, data from the data lines DQ0–3 can be read by the DQ separation method after writing a logical (1) into each of the associated memory locations.

Figure 7:
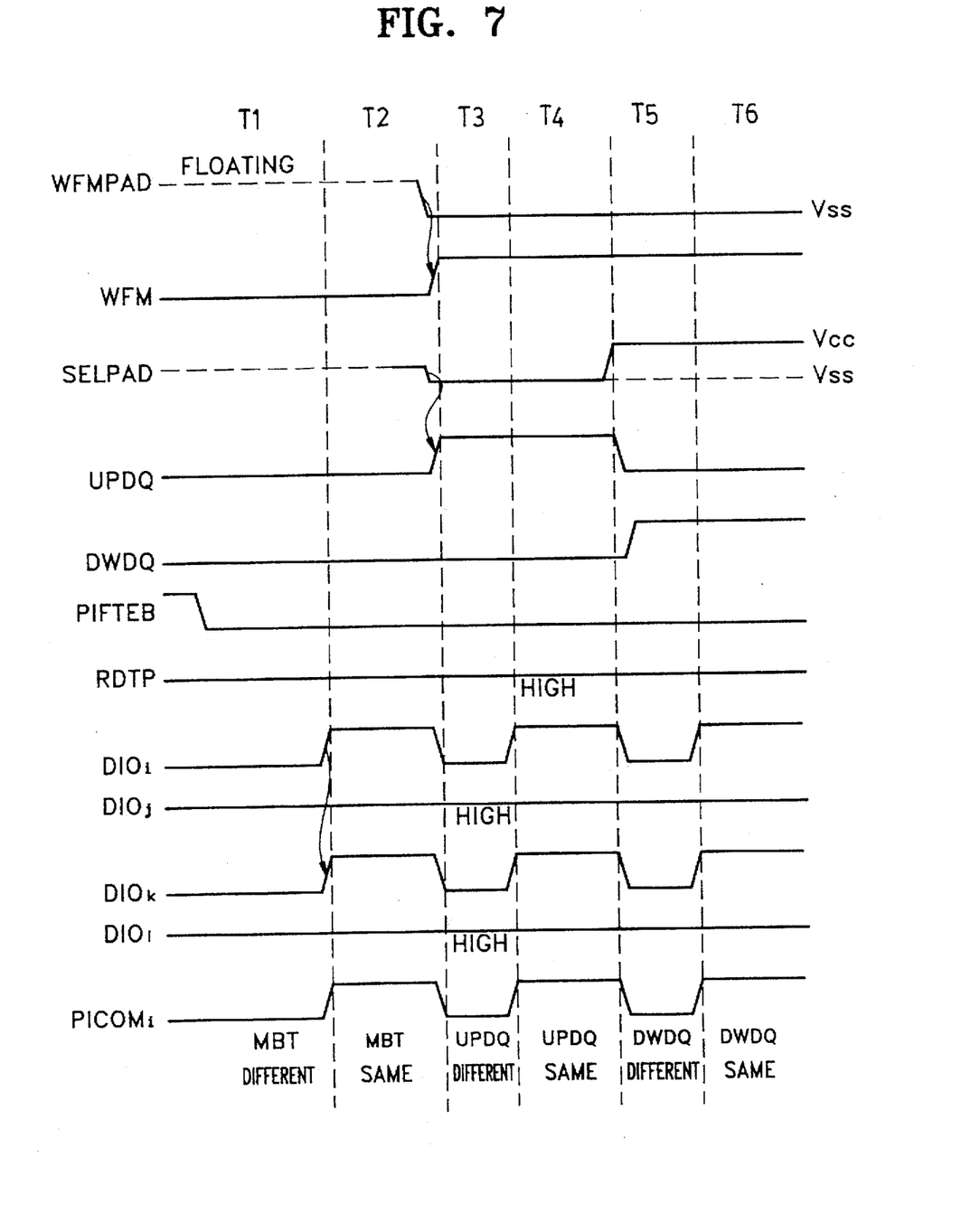
FIG. 7 is a timing diagram illustrating the operation of the multi-bit test circuit of FIG. 2.

To perform a test of one block among the BOT0 or the TOP0 blocks to obtain the redundancy information (RF) in FIG. 1, a ground voltage is applied to the first input port 10 which is a supplementary pad of the memory device as shown in FIG. 3. Accordingly, the internal test mode enable signal WFM is driven to a high logic state as shown in FIG. 7. The high logic state of the WFM signal thus enables the test.

The WFM signal is driven to a low state when either the Vss signal applied to input port 10 is high or the input port 10 is allowed to float. When the WFM signal is low, the UPDQ and DWDQ signals are driven to a logic low state as shown in FIG. 7. When the WFM signal is driven to a high logic state, the UPDQ or the DWDQ can be enabled in a high logic state in response to the Vss/Vcc signal applied to the second input port 14 which is another supplementary pad of the memory device. In particular, when the Vss/Vcc signal applied to port 14 is at a logic low state and the WFM signal is at a logic high state, the UPDQ signal is driven to a logic high state. When the Vss/Vcc signal is at a logic high state or the port 14 is allowed to float, and the WFM signal is at a logic high state, the UPDQ signal is driven to a logic low state and the DWDQ signal is driven to a logic high state.

In FIG. 5, the incorporated four bits are compared at the comparison circuit 18. A logic high signal is output from the comparison circuit when the data is congruous (the same), and a logic low signal is output from the comparison circuit 18 when the data is not congruous. Here, DIOi, DIOj, DIOk and DIOl are data corresponding to each of the four incorporated bits. When both the UPDQ and DWDQ signals have a low logic level (caused by a low logic level WFM signal), all of the data are compared and the result of this comparison is output from the comparison circuit 18. This test is illustrated in time slots T1 and T2 of FIG. 7.

When the WFM signal is driven to a logic high state, and the UPDQ signal is enabled in a logic high state, only data DIOk and DIOl corresponding to the UPDQ are compared at the bit comparison circuit 18. In this case; if data DIOk and DIOl are different, the output of the comparison circuit is driven to a low logic state as shown at time slot T3 of FIG. 7. If data DIOk and DIOl are at the same logic level, the output of the comparison circuit 18 is driven to a logic high state as shown in time slot T4 of FIG. 7.

When the DWDQ signal is driven to a logic high state, the data DIOi and DIOj are compared and the result of the comparison is output from the comparison circuit 18. With reference to time slot T5 of FIG. 7, when data DIOi and DIOj have different logic levels, the output of the comparison circuit 18 is driven to a low logic level. When the data DIOi and DIOj have the same logic level, the output of the comparison circuit 18 is driven to a high logic state as shown in time slot T6 of FIG. 7.

In FIG. 5, the latch circuit 20 latches the output of the bit comparison circuit 18 using the RDTP and PIFTEB signals of FIG. 7. When the latch circuit is not in the multi-bit test mode, the PIFTEB signal is pre-charged to a logic high state, and the PICOMi signal of FIG. 5 is pre-charged to a logic high state by means of the PMOS transistor. If the compared data is the same, the PICOMi signal is output in a logic high state, and if the compared data is not the same, the PICOMi signal is output in a logic low state.

In FIG. 6, when the PICOMi signal is driven to a logic low state because the compared data is different, the DIO and DIOB are both output at a logic low state. The DIO and DIOB are signals which drive a data output buffer, and when the signals become low, neither the pull-up nor pull-down transistors of the data output buffer is driven and the data output takes on a high impedance state.

When the PICOMi signal is driven to a high logic state due to the congruity (sameness) of the compared data, the DIO and DIOB signals are output by the DBIB having the same information as the original data of the memory device. Accordingly, data with a high or low logic level having the same value as that stored in memory, is output from the data output buffer. When the UPDQ is at a high logic level, data can be output from DQ3, DQ7, DQ11, DQ15, DQ16, DQ20, DQ24 and DQ28 as representative of the DQ to be tested. Data corresponding to the above-mentioned DQs is connected with the DBIB. When the DWDQ signal is driven to a high logic level, data can be output from DQ1, DQ5, DQ9, DQ13, DQ18, DQ22, DQ26 and DQ30 as representative of the DQ to be tested. Data corresponding to the above-mentioned DQs is connected with the DBIBMBT.

Thus, in the memory device of FIG. 1, redundancy repair means can be used to obtain the test information with respect to the BOT0 block during a multi-bit test. In this case, the A result corresponding to the DQ0-3 data is read in a state where the DWDQ signal is enabled at a logic high state by applying the appropriate signals to the input ports 10 and 14. The E result corresponding to the DQ16-19 is read in a state where the UPDQ signal is enabled at a high logic level by applying a signal with a low logic level to input port 10 and applying a signal with a low logic level to the second input port 14. In this case, the hatched block is primarily selected by the block selection information. Accordingly, the present invention provides a reduction in the time and cost required to test because particular bits can be separately tested during the multi-bit test.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method for testing a plurality of data bits in an integrated circuit memory device having a test circuit therein, said method comprising the steps of:

accepting the plurality of data bits at the test circuit;

comparing a first data bit and a second data bit from the plurality of data bits to determine if said first and second data bits have a common data value in response to a first test mode signal;

generating a first comparison signal responsive to said first test mode signal and responsive to said comparison of said first and second data bits wherein said first comparison signal has a first logic state when said first and second data bits have a common data value and a second logic state when said first and second data bits have different data values;

comparing a third data bit and a fourth data bit from the plurality of data bits to determine if said third and fourth data bits have a common data value responsive to a second test mode signal;

generating a second comparison signal responsive to said second test mode signal and responsive to said comparison of said third and fourth data bits wherein said second comparison signal has the first logic state when said third and fourth data bits have a common data value and the second logic state when said third and fourth data bits have different data values;

comparing said first, second, third, and fourth data bits to determine if said first, second, third, and fourth data bits have a common data value in response to a third test mode signal: and generating a third comparison signal responsive to said third test mode signal and responsive to said comparison of said first, second, third, and fourth data bits wherein said third comparison signal has the first logic state when said first, second, third, and fourth data bits have a common data value and the second logic state when said first, second, third, and fourth data bits have different data values.

2. A method for testing a plurality of data bits in an integrated circuit memory device having a test circuit therein, said method comprising the steps of:

accepting the plurality of data bits at the test circuit:

comparing a first data bit and a second data bit from the plurality of data bits to determine if said first and second data bits have a common data value;

generating a first comparison signal responsive to said comparison of said first and second data bits wherein said first comparison signal has a first logic state when said first and second data bits have a common data value and a second logic state when said first and second data bits have different data values;

comparing a third data bit and a fourth data bit from the plurality of data bits to determine if said third and fourth data bits have a common data value:

generating a second comparison signal responsive to said comparison of said third and fourth data bits wherein said second comparison signal has the first logic state when said third and fourth data bits have a common data value and the second logic state when said third and fourth data bits have different data values; and latching the comparison signals responsive to a read data transmission signal.

3. A method according to claim 1 further comprising the step of driving first and second output lines at a common logic state when the compared data bits have different data values.

4. A method according to claim 3 further comprising the step of driving a data output buffer to a high impedance state when said first and second output lines are driven at the common logic state.

5. A method according to claim 1 further comprising the step of driving a first output line to a first logic state and driving a second output line to a second logic state different from said first logic state when the compared data bits have a common data value.

6. A test circuit for an integrated circuit memory device, said test circuit comprising:

test mode selection means for selecting one of a first test mode and a second test mode responsive to an external selection signal applied to the memory device;

bit comparison means responsive to a plurality of data bits and to said test mode selection means, for comparing a first data bit and a second data bit from said plurality of data bits when the first test mode is selected, and for comparing a third data bit and a fourth data bit from said plurality of data bits when the second test mode is selected; and comparison output generating means responsive to said bit comparison means, for generating an output signal having a first logic state when the compared data bits have a common data value and for generating an output signal having a second logic state when the compared data bits have different data values;

wherein said test mode selection means further selects one of the first test mode, the second test mode, and a third test mode responsive to the external selection signal applied to the memory device; and wherein said bit comparison means compares the first, second, third, and fourth data bits when the third test mode is selected.

7. A test circuit for an integrated circuit memory device, said test circuit comprising:

test mode selection means for selecting one of a first test mode and a second test mode responsive to an external selection signal applied to the memory device;

bit comparison means responsive to a plurality of data bits and to said test mode selection means, for comparing a first data bit and a second data bit from said plurality of data bits when the first test mode is selected, and for comparing a third data bit and a fourth data bit from said plurality of data bits when the second test mode is selected;

comparison output generating means responsive to said bit comparison means, for generating an output signal having a first logic state when the compared data bits have a common data value and for generating an output signal having a second logic state when the compared data bits have different data values; and latch means for latching said output signal responsive to a read data transmission signal.

8. A test circuit according to claim 6 further comprising bus control means for driving first and second output lines responsive to said comparison output generating means, wherein said bus control means drives said first and second output lines at a common logic state when the compared data bits have different data values.

9. A test circuit according to claim 8 further comprising a data output buffer driven by said first and second output lines so that when said first and second output lines are driven at the common logic state, said data output buffer assumes a high impedance state.

10. A test circuit according to claim 6 further comprising bus control means for driving first and second output lines responsive to said comparison output generating means, wherein said bus control means drives said first and second output lines to respective first and second opposing logic states when the compared data bits have a common data value.

11. A test circuit for an integrated circuit memory device, said test circuit comprising:

a test mode selection circuit which generates an internal test mode selection signal responsive to a test mode enable signal and a test mode selection signal;

a bit comparison circuit which compares a plurality of data bit values to determine congruity of the bit values in response to the internal test mode selection signal, and which generates a congruity output signal responsive to said comparisons;

a latch circuit which latches the congruity output in response to a read data transmission signal and a multi-bit test mode signal; and a bus control circuit which connects a data bus to a data input/output line in response to the latched congruity output and the internal test mode selection signal.

12. A test circuit for an integrated circuit memory device according to claim 11 wherein said test mode selection circuit comprises:

a first input port which receives the test mode enable signal;

a first input circuit which generates an internal test mode enable signal in response to the test mode enable signal;

a second input port which receives the test mode selection signal; and a second input circuit which generates the internal test mode selection signal in response to the test mode selection signal and the internal test mode enable signal.

* * * * *